(12) United States Patent
Chen et al.

(10) Patent No.: US 6,519,736 B1
(45) Date of Patent: Feb. 11, 2003

(54) GENERATING SPECIAL UNCORRECTABLE ERROR CODES FOR FAILURE ISOLATION

(75) Inventors: Chin-Long Chen, Fishkill, NY (US); Mu-Yue Hsiao, Poughkeepsie, NY (US); Patrick J. Meaney, Poughkeepsie, NY (US); William Wu Shen, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/452,079

(22) Filed: Nov. 30, 1999

(51) Int. Cl.[7] .......................... G11C 29/00; H03M 13/00
(52) U.S. Cl. ........................................ 714/768; 714/758
(58) Field of Search ............................... 714/777, 807, 714/718, 756, 799, 781, 768, 758, 763, 20, 3–5, 8

(56) References Cited

U.S. PATENT DOCUMENTS

| | | | |
|---|---|---|---|
| 4,241,446 A | * 12/1980 | Trubisky | 714/777 |
| 4,464,753 A | 8/1984 | Chen | 371/38 |
| 4,782,490 A | * 11/1988 | Tenengolts | 714/756 |
| 4,862,463 A | 8/1989 | Chen | 371/38 |
| 5,682,394 A | * 10/1997 | Blake et al. | 714/718 |
| 5,774,481 A | 6/1998 | Meaney et al. | 371/40.1 |
| 5,841,795 A | 11/1998 | Olarig et al. | 370/40.13 |
| 6,141,789 A | * 10/2000 | Cypher | 714/5 |
| 6,233,716 B1 | * 5/2001 | Cypher | 714/777 |

OTHER PUBLICATIONS

Chen, C.L., and Hsiao, M.Y., Error–Correcting Codes for Semiconductor Memory Applications: A State–of–the–Art Review, 28 IBM Journal of Research and Development, 124 (Mar., 1984).

* cited by examiner

Primary Examiner—Albert Decady
Assistant Examiner—Cynthia Britt
(74) Attorney, Agent, or Firm—Lawrence D. Cutter, Esq.; Kevin P. Radigan, Esq.; Heslin Rothenberg Farley & Mesiti P.C.

(57) ABSTRACT

Uncorrectable errors are isolated to one component of a computing system comprising a plurality of components. First, upon detection of an uncorrectable error, a special check bit pattern is generated. This check bit pattern is used to indicate the occurrence of an uncorrectable error, as well as the location of the occurrence of the error. Subsequently, the check bit pattern is incorporated into the data word being transmitted, and thus may be used to isolate an uncorrectable error to the exact location of occurrence.

28 Claims, 13 Drawing Sheets

DATA IN
10, 12, 14, 16, 18, 20, 22, 24, 36, 38, 40, 42, 44
46, 48, 50, 62, 64, 66, 68, 70, 72, 74, 76, 88, 90
92, 94, 96, 98, 100, 102, 114, 116, 118, 120, 122, 124, 126, 128

$$H = \begin{bmatrix} M_0 M_0 M_0 M_0 M_0 V_0 V_0 \\ M_1 M_5 M_4 M_3 M_2 V_0 V_0 \\ M_2 M_1 M_5 M_4 M_3 V_0 V_1 \\ M_3 M_2 M_1 M_5 M_4 V_0 V_1 \\ M_4 M_3 M_2 M_1 M_5 V_1 V_0 \\ M_5 M_4 M_3 M_2 M_1 V_1 V_0 \end{bmatrix} I_{12}$$

$$M_0 = \begin{bmatrix} 000000000010101010101010 \\ 000000000001010101010101 \end{bmatrix}$$

$$M_1 = \begin{bmatrix} 001011110100001001001010100 \\ 000110101100000111001011000 \end{bmatrix}$$

$$M_2 = \begin{bmatrix} 000000011010110000011010111 \\ 000000110101100000110101110 \end{bmatrix}$$

$$M_3 = \begin{bmatrix} 101000101010001110000000100 \\ 010100010101001001000000010 \end{bmatrix}$$

$$M_4 = \begin{bmatrix} 100010001000100011111010100 \\ 010001000100010010100101010 \end{bmatrix}$$

$$M_5 = \begin{bmatrix} 101001001000000000100111110 \\ 010111000100000000011110100 \end{bmatrix}$$

$$V_0 = \begin{bmatrix} 10 \\ 01 \end{bmatrix}$$

$$V_1 = \begin{bmatrix} 01 \\ 11 \end{bmatrix}$$

$$I_{12} = \begin{bmatrix} 100000000000 \\ 010000000000 \\ 001000000000 \\ 000100000000 \\ 000010000000 \\ 000001000000 \\ 000000100000 \\ 000000010000 \\ 000000001000 \\ 000000000100 \\ 000000000010 \\ 000000000001 \end{bmatrix}$$

| 19 | 20 | 21 | 22 | 23 | 24 | 25 | 26 | 27 | 28 | 29 | 30 | 31 | 32 | 33 | 34 | 35 | 36 | 37 |
|----|----|----|----|----|----|----|----|----|----|----|----|----|----|----|----|----|----|----|
| 101 | 101 | 101 | 101 | 101 | 101 | 101 | 000 | 000 | 000 | 000 | 000 | 101 | 101 | 101 | 101 | 101 | 101 | 101 |
| 011 | 011 | 011 | 011 | 011 | 011 | 011 | 000 | 000 | 000 | 000 | 000 | 011 | 011 | 011 | 011 | 011 | 011 | 011 |
| 000 | 000 | 000 | 101 | 011 | 110 | 110 | 101 | 000 | 000 | 000 | 000 | 000 | 101 | 000 | 011 | 110 | 011 | 101 |
| 000 | 000 | 000 | 011 | 110 | 101 | 101 | 011 | 000 | 000 | 000 | 101 | 101 | 011 | 000 | 110 | 110 | 101 | 101 |
| 000 | 000 | 101 | 000 | 101 | 011 | 000 | 000 | 000 | 101 | 000 | 011 | 000 | 000 | 000 | 101 | 101 | 011 | 011 |
| 000 | 101 | 011 | 000 | 110 | 000 | 101 | 101 | 101 | 011 | 000 | 101 | 000 | 000 | 000 | 000 | 000 | 110 | 110 |
| 110 | 011 | 110 | 101 | 011 | 110 | 000 | 011 | 011 | 110 | 000 | 011 | 000 | 000 | 000 | 000 | 011 | 110 | 101 |
| 101 | 000 | 000 | 011 | 011 | 101 | 011 | 000 | 110 | 110 | 110 | 110 | 101 | 110 | 101 | 011 | 000 | 110 | 101 |
| 000 | 000 | 000 | 101 | 011 | 101 | 101 | 000 | 011 | 101 | 101 | 101 | 101 | 101 | 000 | 110 | 000 | 110 | 011 |
| 000 | 110 | 101 | 101 | 011 | 011 | 000 | 000 | 000 | 000 | 000 | 011 | 011 | 101 | 000 | 000 | 011 | 101 | 101 |
| 101 | 101 | 011 | 011 | 000 | 011 | 011 | 101 | 000 | 000 | 101 | 101 | 101 | 000 | 000 | 000 | 110 | 011 | 011 |
| 000 | 000 | 110 | 000 | 000 | 101 | 101 | 101 | 101 | 000 | 101 | 101 | 011 | 000 | 110 | 000 | 000 | 000 | 000 |
| 000 | 101 | 101 | 101 | 101 | 101 | 011 | 011 | 011 | 000 | 011 | 011 | 011 | 000 | 101 | 101 | 000 | 000 | 000 |
| 101 | 000 | 000 | 011 | 011 | 011 | 011 | 011 | 011 | 011 | 011 | 011 | 011 | 000 | 101 | 011 | 000 | 000 | 000 |
| 011 | 000 | 101 | 101 | 000 | 000 | 000 | 000 | 000 | 000 | 000 | 000 | 000 | 000 | 000 | 000 | 000 | 000 | 000 |

*fig. 11B*

| 38 | 39 | 40 | 41 | 42 | 43 | 44 | 45 | 46 | 47 | 48 | 49 | 50 | 51 | 52 | 53 | 54 | 55 | 56 |
|---|---|---|---|---|---|---|---|---|---|---|---|---|---|---|---|---|---|---|
| 101 | 000 | 000 | 000 | 000 | 000 | 101 | 101 | 101 | 101 | 101 | 101 | 101 | 101 | 000 | 000 | 000 | 000 | 000 |
| 011 | 000 | 000 | 000 | 000 | 000 | 011 | 011 | 011 | 011 | 011 | 011 | 011 | 011 | 000 | 000 | 000 | 000 | 000 |
| 101 | 101 | 101 | 000 | 101 | 101 | 101 | 000 | 110 | 110 | 011 | 011 | 011 | 101 | 000 | 000 | 000 | 000 | 101 |
| 011 | 000 | 011 | 000 | 011 | 011 | 011 | 000 | 101 | 101 | 000 | 000 | 000 | 101 | 101 | 000 | 000 | 011 | 011 |
| 110 | 101 | 000 | 101 | 000 | 101 | 000 | 000 | 101 | 011 | 000 | 000 | 101 | 011 | 011 | 101 | 000 | 110 | 011 |
| 101 | 101 | 000 | 101 | 000 | 011 | 000 | 101 | 000 | 110 | 110 | 101 | 011 | 101 | 011 | 101 | 000 | 000 | 101 |
| 011 | 000 | 000 | 101 | 000 | 011 | 000 | 011 | 000 | 101 | 101 | 011 | 110 | 011 | 110 | 011 | 000 | 000 | 101 |
| 000 | 101 | 000 | 000 | 000 | 101 | 000 | 000 | 000 | 000 | 101 | 011 | 101 | 110 | 101 | 000 | 101 | 000 | 101 |
| 000 | 000 | 000 | 101 | 000 | 011 | 000 | 000 | 000 | 000 | 011 | 110 | 011 | 101 | 011 | 000 | 011 | 000 | 101 |
| 110 | 000 | 101 | 110 | 110 | 011 | 000 | 000 | 101 | 000 | 000 | 110 | 110 | 000 | 000 | 101 | 011 | 000 | 000 |
| 101 | 000 | 011 | 101 | 101 | 101 | 000 | 000 | 011 | 011 | 000 | 101 | 101 | 000 | 011 | 101 | 110 | 000 | 011 |
| 101 | 000 | 000 | 000 | 011 | 101 | 101 | 110 | 000 | 110 | 011 | 101 | 101 | 110 | 000 | 011 | 110 | 110 | 011 |
| 101 | 000 | 000 | 000 | 000 | 011 | 011 | 101 | 000 | 000 | 110 | 011 | 011 | 101 | 000 | 000 | 101 | 101 | 011 |
| 011 | 000 | 000 | 000 | 110 | 011 | 011 | 000 | 000 | 000 | 000 | 000 | 110 | 011 | 011 | 011 | 011 | 101 | 110 |

*fig. 11C*

| 57 | 58 | 59 | 60 | 61 | 62 | 63 | 64 | 65 | 66 | 67 | 68 | 69 | 70 | 71 | 72 |
|---|---|---|---|---|---|---|---|---|---|---|---|---|---|---|---|
| 101 | 101 | 101 | 101 | 101 | 101 | 101 | 101 | 101 | 101 | 101 | 000 | 000 | 000 | 000 | 000 |
| 011 | 011 | 011 | 011 | 011 | 011 | 011 | 011 | 011 | 011 | 011 | 000 | 000 | 000 | 000 | 000 |
| 101 | 110 | 000 | 000 | 011 | 101 | 101 | 110 | 101 | 101 | 000 | 101 | 000 | 000 | 000 | 000 |
| 011 | 101 | 000 | 000 | 110 | 011 | 011 | 101 | 011 | 011 | 000 | 011 | 000 | 000 | 000 | 000 |
| 101 | 000 | 110 | 101 | 000 | 000 | 000 | 101 | 101 | 110 | 000 | 000 | 101 | 000 | 000 | 000 |
| 011 | 000 | 101 | 011 | 000 | 000 | 000 | 011 | 011 | 101 | 000 | 000 | 011 | 000 | 000 | 000 |
| 000 | 101 | 000 | 110 | 101 | 101 | 101 | 011 | 011 | 011 | 000 | 000 | 000 | 101 | 000 | 000 |
| 000 | 011 | 000 | 101 | 011 | 011 | 011 | 110 | 110 | 110 | 000 | 000 | 000 | 011 | 000 | 000 |
| 000 | 000 | 101 | 000 | 101 | 101 | 101 | 101 | 101 | 101 | 101 | 000 | 000 | 000 | 101 | 000 |
| 000 | 000 | 011 | 000 | 011 | 011 | 011 | 011 | 011 | 011 | 011 | 000 | 000 | 000 | 011 | 000 |
| 000 | 000 | 000 | 101 | 000 | 101 | 110 | 110 | 110 | 101 | 000 | 000 | 000 | 000 | 000 | 101 |
| 000 | 000 | 000 | 011 | 000 | 011 | 101 | 101 | 011 | 011 | 000 | 000 | 000 | 000 | 000 | 011 |

*fig. 11D*

$$H = \begin{bmatrix} M_0V_0 & M_0V_0 & M_0V_0 & M_0V_0 & M_0V_0 \\ M_1V_0 & M_5V_1 & M_4V_1 & M_3V_0 & M_2V_0 \\ M_2V_0 & M_1V_0 & M_5V_1 & M_4V_1 & M_3V_0 \\ M_3V_0 & M_2V_0 & M_1V_0 & M_5V_1 & M_4V_1 \\ M_4V_1 & M_3V_0 & M_2V_0 & M_1V_0 & M_5V_1 \\ M_5V_1 & M_4V_1 & M_3V_0 & M_2V_0 & M_1V_0 \end{bmatrix} I_{12}$$

$$M_0 = \begin{bmatrix} 000000000010101010101010 \\ 000000000001010101010101 \end{bmatrix}$$

$$M_1 = \begin{bmatrix} 001011110100001001100100 \\ 000110101100001110010110 0 \end{bmatrix}$$

$$M_2 = \begin{bmatrix} 000000011010110000011010 11 \\ 000000110101100000110101 10 \end{bmatrix}$$

$$M_3 = \begin{bmatrix} 101000101010001110000000 10 \\ 010100010101001001000000 01 \end{bmatrix}$$

$$M_4 = \begin{bmatrix} 100010001000100011111010 10 \\ 010001000100010010100101 01 \end{bmatrix}$$

$$M_5 = \begin{bmatrix} 101001001000000000100111 11 \\ 010111000100000000011110 10 \end{bmatrix}$$

$$V_0 = \begin{bmatrix} 10 \\ 01 \end{bmatrix}$$

$$V_1 = \begin{bmatrix} 01 \\ 11 \end{bmatrix}$$

$$I_{12} = \begin{bmatrix} 100000000000 \\ 010000000000 \\ 001000000000 \\ 000100000000 \\ 000010000000 \\ 000001000000 \\ 000000100000 \\ 000000010000 \\ 000000001000 \\ 000000000100 \\ 000000000010 \\ 000000000001 \end{bmatrix}$$

*fig. 12*

$$H = \begin{bmatrix} M_0V_0V_0 & M_0V_0V_0 & M_0V_0V_0 & M_0V_0V_0 & M_0V_0V_0 \\ M_1V_0V_0 & M_5V_1V_2 & M_4V_1V_2 & M_3V_0V_0 & M_2V_0V_1 \\ M_2V_0V_1 & M_1V_0V_0 & M_5V_1V_2 & M_4V_1V_2 & M_3V_0V_0 \\ M_3V_0V_0 & M_2V_0V_1 & M_1V_0V_0 & M_5V_1V_2 & M_4V_1V_2 \\ M_4V_1V_2 & M_3V_0V_0 & M_2V_0V_1 & M_1V_0V_0 & M_5V_1V_2 \\ M_5V_1V_2 & M_4V_1V_2 & M_3V_0V_0 & M_2V_0V_1 & M_1V_0V_0 \end{bmatrix} I_{12}$$

$$M_0 = \begin{bmatrix} 00000000001010101010101010 \\ 00000000000101010101010101 \end{bmatrix}$$

$$M_1 = \begin{bmatrix} 00101111010000100100110100 \\ 00011010110000011100101100 \end{bmatrix}$$

$$M_2 = \begin{bmatrix} 00000001101011000001101011 \\ 00000011010110000011010110 \end{bmatrix}$$

$$M_3 = \begin{bmatrix} 10100010101000111000000010 \\ 01010001010100100100000001 \end{bmatrix}$$

$$M_4 = \begin{bmatrix} 10001000100010001111101010 \\ 01000100010010010100010101 \end{bmatrix}$$

$$M_5 = \begin{bmatrix} 10100100100000000010011111 \\ 01011100010000000001111010 \end{bmatrix}$$

$$V_0 = \begin{bmatrix} 10 \\ 01 \end{bmatrix}$$

$$V_1 = \begin{bmatrix} 01 \\ 11 \end{bmatrix}$$

$$V_2 = \begin{bmatrix} 11 \\ 10 \end{bmatrix}$$

$$I_{12} = \begin{bmatrix} 100000000000 \\ 010000000000 \\ 001000000000 \\ 000100000000 \\ 000010000000 \\ 000001000000 \\ 000000100000 \\ 000000010000 \\ 000000001000 \\ 000000000100 \\ 000000000010 \\ 000000000001 \end{bmatrix}$$

fig. 13

GENERATING SPECIAL UNCORRECTABLE ERROR CODES FOR FAILURE ISOLATION

CROSS-REFERENCES TO RELATED APPLICATIONS

This application contains subject matter which is related to the subject matter of the following applications, each of which is assigned to the same assignee as this application and filed on the same day as this application. Each of the below listed applications is hereby incorporated herein by reference in its entirety:

"Single Symbol Correction Double Symbol Detection Code Employing A Modular H-Matrix," Chen et al., Ser. No. 09/451,133;

"Detecting Address Faults In An ECC-Protected Memory," Chen et al., Ser. No. 09/451,261; and, "Method, System And Program Products For Error Correction Code Conversion," Chen et al., Ser. No. 09/450,548.

TECHNICAL FIELD

This invention relates, in general, to computer error correction codes, and in particular, to generating a special error correction code for failure isolation.

BACKGROUND

The small size of computer transistors and capacitors, combined with transient electrical and electromagnetic phenomena cause occasional errors in stored information in computer memory systems. Therefore, even well-designed and generally reliable memory systems are susceptible to memory device failures.

In an effort to minimize the effects of these memory device failures, various error checking schemes have been developed to detect, and in some cases correct, errors in messages read from memory. The simplest error detection scheme is the parity bit. A parity bit is an extra bit included with a binary data message or data word to make the total number of 1's in the message either odd or even. For "even parity" systems, the parity bit is set to make the total number of 1's in the message even. For "odd parity" systems, the parity bit is set to make the total number of 1's in the message odd. For example, in a system utilizing odd parity, a message having two 1's would have its parity bit set to 1, thereby making the total number of 1's odd. Then, the message including the parity bit is transmitted and subsequently checked at the receiving end for errors. An error results if the parity of the data bits in the message does not correspond to the parity bit transmitted. As a result, single bit errors can be detected. However, since there is no way to detect which particular bit is in error, correction is not possible. Furthermore, if two or any even number of bits are in error, the parity will be correct and no error will be detected. Parity therefore is capable of detecting only odd numbers of errors and is not capable of correcting any bits determined to be in error.

Error correction codes (ECCs) have thus been developed to not only detect but also correct bits determined to be in error. ECCs utilize multiple parity check bits stored with the data message in memory. Each check bit is a parity bit for a group of bits in the data message. When the message is read from memory, the parity of each group, including the check bit, is evaluated. If the parity is correct for all of the groups, it signifies that no detectable error has occurred. If one or more of the newly generated parity values are incorrect, a unique pattern called a syndrome results which may be used to identify the bit in error. Upon detection of the particular bit in error, the error may be corrected by complementing the erroneous bit.

A widely used type of ECC utilized in error control in digital systems is based on the codes devised by R. W. Hamming, and thus take the name "Hamming codes". One particular subclass of Hamming codes includes the single error correcting and double error detecting (SEC-DED) codes. As their name suggests, these codes may be utilized not only to correct any single bit error but also to detect double bit errors.

Another type of well-known ECC is the single symbol correction and double symbol detection (SSC-DSD) codes which are used to correct single symbol errors and detect double symbol errors. In systems implementing these types of codes, the symbol represents a multiple bit package or chip. Hence, as the name implies, an SSC-DSD code in a system utilizing n bit symbols would be capable of correcting n bits in a single symbol and detecting errors occurring in double symbols.

One limitation of typical ECCs is their inability to isolate uncorrectable errors to individual components of computing systems. For instance, although these ECCs are able to detect the occurrence of an uncorrectable error at a particular component of a computing system, no measure is taken to indicate the exact location of data corruption. Thus, after subsequent transmissions of the data, even though a user may be aware of the fact that the data had been corrupted, the user would not be aware of the location or component where the error actually occurred.

Accordingly, a need exists for an uncorrectable error isolation measure which is capable of isolating the occurrence of an uncorrectable error to a particular component of a computing system.

SUMMARY OF THE INVENTION

The shortcomings of the prior art are overcome and additional advantages are provided through the provision of an uncorrectable error isolation capability which isolates an uncorrectable error to one component of a plurality of components of a computing system. In one example, a method of isolating these uncorrectable errors includes: generating, upon detection of an uncorrectable error in a data word at the one component of the computing system, a check bit pattern to indicate occurrence of the uncorrectable error at the one component; and incorporating the check bit pattern into the data word.

In another example of the invention, a system for isolating an uncorrectable error to one component of a plurality of components of a computing system includes: means for generating, upon detection of an uncorrectable error in a data word at the one component of the computing system, a check bit pattern to indicate occurrence of the uncorrectable error at the one component; and means for incorporating the check bit pattern into the data word.

In still yet another example of the invention, an article of manufacture comprises a computer usable medium having computer readable program code means embodied therein for isolating an uncorrectable error to one component of a plurality of components of a computing system. The computer readable program code means includes: a computer useable medium having computer readable programs code means embodied therein for isolating an uncorrectable error to one component of a plurality of components of a computing system, the computer readable program code means in the article of manufacture comprising: computer readable program code means for generating, upon detection of an uncorrectable error in a data word at the one component of the computing system, a check bit pattern to indicate occurrence of the uncorrectable error at the one component; and computer readable program code means for incorporating the check bit pattern into the data word.

Thus, described herein is a technique for isolating an uncorrectable error to one component of a plurality of components of a computing system. This technique first generates, upon the detection of an uncorrectable error in a data word at one component of the computing system, a check bit pattern to indicate the occurrence of an uncorrectable error. In addition, the check bit pattern is generated to correspond to a particular component of the computing system. Thus, each check bit pattern may be used to identify a particular component determined to be flawed or damaged. Subsequently, the check bit pattern is incorporated into the data word. In this manner, information regarding the occurrence of an uncorrectable error, as well as the location of the error, is transmitted with the data word. Thereafter, any appropriate recovery actions may be taken to address the uncorrectable error.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 10 depicts one example of an H-matrix according the present invention;

FIGS. 11A–11D depict one example of a syndrome decoding table generated according to the H-matrix of FIG. 10;

FIG. 12 depicts another example of an H-matrix according the present invention;

FIG. 13 depicts yet another example of an H-matrix according the present invention.

BEST MODE FOR CARRYING OUT THE INVENTION

In accordance with the principles of the present invention, uncorrectable errors occurring in a component of a plurality of components of a computing system are isolated. In one example, a check bit pattern is generated upon the detection of an uncorrectable error in a data word at one component of the computing system. The generated check bit pattern corresponds to a particular component in the computing system, namely the component responsible for causing the uncorrectable error, and hence this check bit pattern indicates the occurrence of the uncorrectable error at one flawed component of the computing system. Subsequently, the check bit pattern is incorporated into the data word being transmitted and is thus transmitted along with the data. In this manner, information regarding the occurrence of an uncorrectable error, as well as the location of the error, is transmitted with the data word. One example of a computer system incorporating and utilizing the present invention is described in detail with reference to FIG. 1.

Figure 1:
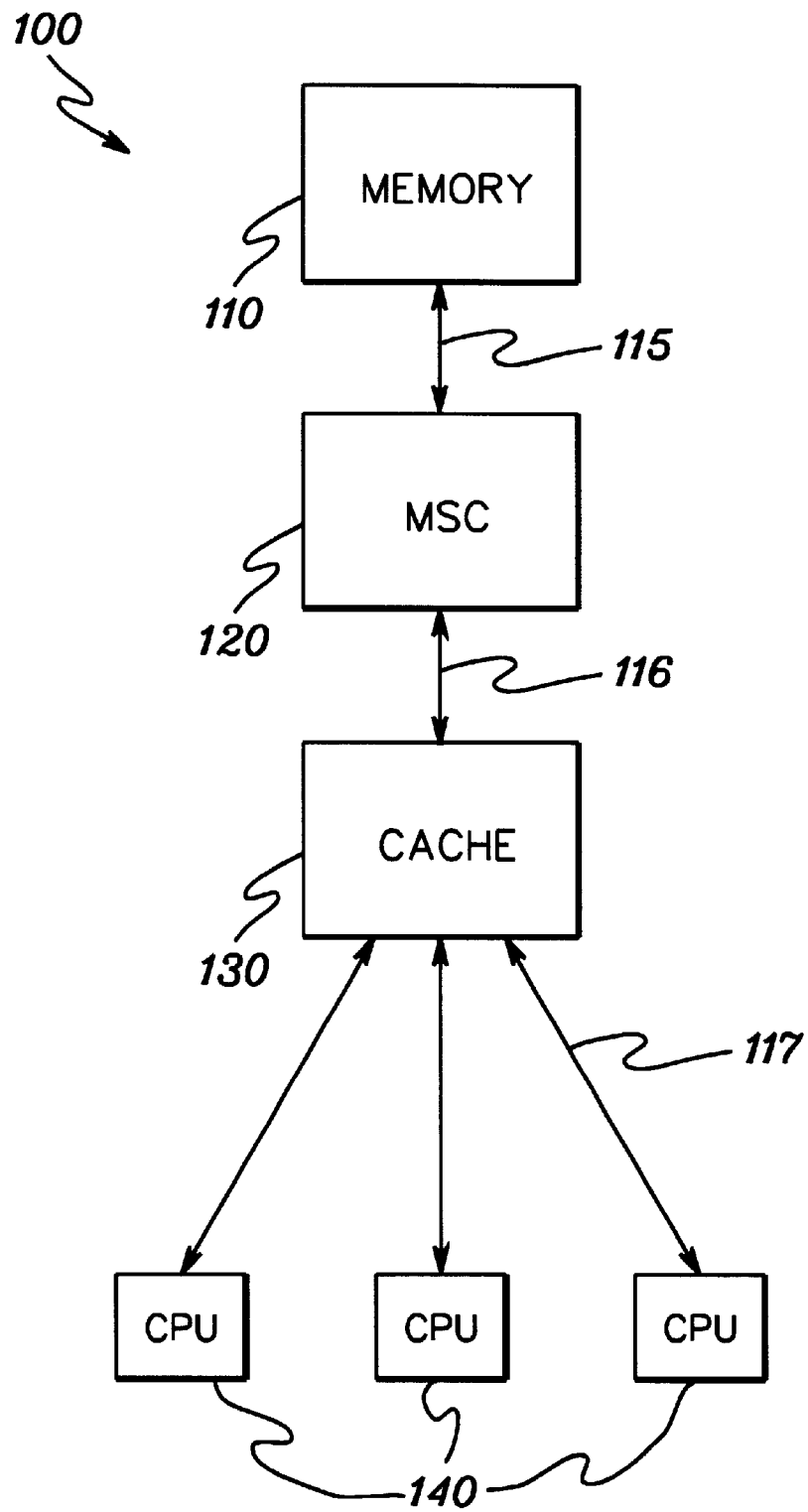
FIG. 1 depicts one example of a computer system in which error correction and/or detection in accordance with the principles of the present invention may be utilized.

FIG. 1 shows a block diagram representation of a computer system 100 utilizing the error correction code of the present invention. In one embodiment, computer system 100 includes a memory 110 connected to a main storage controller (MSC) 120 via a data bus 115, a cache 130 connected to MSC 120 via an MSC/cache interface 116, and a plurality of central processing units (CPUs) 140 connected to cache 130 via data buses 117. MSC/cache interface 116 and data buses 117 are used to communicate data between MSC 120 and cache 130, as well as between cache 130 and CPUs 140, respectively, and in this regard may typically be 72 bits wide. Communication of data between memory 110 and MSC 120, on the other hand, occurs via data bus 115. Thus, data bus 115 facilitates the transmission of data read from memory 110 by MSC 120 as well as data written to memory 110 by MSC 120.

Data bus 115, in one embodiment, is 146 bits wide but nevertheless may vary in width according to the requirements of the particular system while still receiving error protection under the ECC of the present invention. In this regard, the ECC of the present invention is specifically designed to meet the data requirements of a wide variety of servers including data buses having widths of, for example, 140, 142, 143, 144, 152, and 162 bits.

The data transmitted in computer system 100 is arranged into a data word having a size dependent on the particular data bus utilized by the system. Furthermore, the data word may be arranged into variably-sized symbols. For instance, in one example, the data word comprises a plurality of two bit symbols. Hence, in this example, a 146 bit data word would include 73 symbols.

Figure 2:
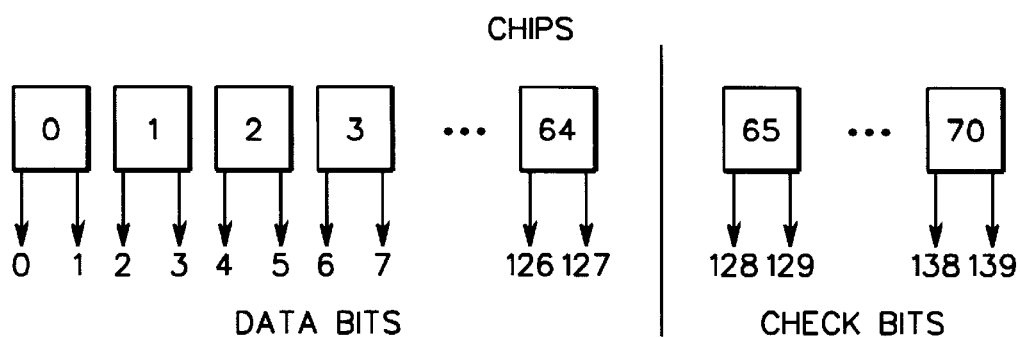
FIG. 2 depicts one example of a memory arrangement in accordance with the present invention.

As shown in FIG. 2, memory 110, for example, comprises a plurality of DRAM devices with each device storing a two-bit package of data on a single chip or symbol. For instance, data bits 0 and 1 are stored on chip 0, and similarly bits 2 and 3 are stored on chip 1. In addition, the embodiment shown in FIG. 2 depicts a 140 bit memory system which is arranged such that the first 128 bits (0–127) are used for data storage and the last 12 bits (128–139) are used to store a plurality of check bits.

In accordance with the principles of the present invention, the check bits are generated as data is transmitted from MSC 120 to memory 110. Upon generation, the check bits are stored, together with the transmitted data, in memory 110. As mentioned above, in the embodiment depicted in FIG. 2, twelve check bits are generated and stored on chips 65–70, with each check bit being associated with a group of data bits stored on chips 0–64. The generation of the check bits is discussed below in detail with reference to FIGS. 2, 3, 10, 12 and 13.

FIGS. 10, 12 and 13 depict various embodiments of an H-matrix generated in accordance with the principles of the present invention. In each of FIGS. 10, 12 and 13, the H-matrix is shown comprising a plurality of subsets arranged in a plurality of rows and columns. In addition, each of at least one of the rows comprises, in part, multiple iterations of one subset of the plurality of subsets, whereas the remainder of the rows comprises, in part, a cyclic permutation of all of the remaining subsets of the plurality-of subsets.

In the example depicted in FIG. 10, one H-matrix is shown including a plurality of 2×26 modular matrices M0–M5, a plurality of 2×2 matrices V0–V1, and matrix I12, which represents a 12×12 identity matrix. As can be seen, the top row of the H-matrix in FIG. 10 comprises, in part, multiple iterations of subset M0 and the remainder of the rows comprises, in part, a cyclic permutation of the remaining subsets M1–M5. In addition to comprising the subsets M1–M5, the rows of the H-matrix also comprise various iterations of the V0 and V1 matricies, as well as the I12 matrix. Other examples of H-matrices generated according to the principles of the present invention are depicted in FIGS. 12 and 13. Similar to the example shown in FIG. 10, the embodiments depicted in FIGS. 12 and 13 also include a plurality of rows and columns with the top row comprising multiple iterations of one subset and with the remainder of the rows comprising a cyclic permutation of the remaining subsets. Furthermore, although each of the embodiments shown in FIGS. 10, 12 and 13 depicts a top row comprising, in part, multiple iterations of one subset, it is to be understood that the row comprising, in part, multiple iterations of one subset is not limited to the top row of the H-matrix and, to the contrary, any one of the rows of the H-matrix may comprise, in part, multiple iterations of one subset with the remaining rows comprising, in part, a cyclic permutation of the remaining subsets. Also, although each of the embodiments shown in FIGS. 10, 12 and 13 depict a particular arrangement of rows and columns, it is to be understood that each row is interchangeable with any other row, and likewise any column is interchangeable with any other column.

In addition, the H-matrix of the present invention may be implemented so that each subset M0–M5 is iterated no more than five times. For example, in the H-matrix depicted in FIG. 10, each of subsets M0 M1, M2, M3, M4 and M5 is iterated five times each on the left-hand side of the H-matrix before iterating matrices V0 and V1. Similarly, FIGS. 12 and 13 depict H-matrices comprising subsets M0 M1, M2, M3, M4 and M5 each iterated five times with matrices V0, V1 and V2 interposed between the subsets.

As a result of the utilization of the modular structure described above, the H-matrix of the present invention becomes much easier to implement within its particular host computer system.

Figure 4:
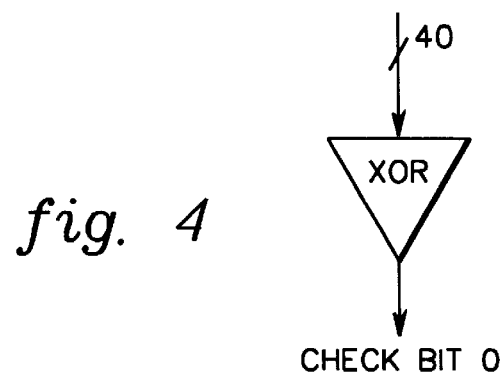
FIG. 4 depicts one example of a portion of the circuit of FIG. 3 used to generate a single check bit.

The H-matrix of FIG. 10, when expanded, has 146 columns and 12 rows. The first 134 columns (M0–M5 and V0 and V1) are designated as data columns and the last 12 columns (I12) are designated as ECC check columns. Furthermore, each row of the H-matrix is associated with and used to generate a single check bit. More specifically, each instance of a 1 in a row designates a data bit which is to be included in a specific group of data bits. This specific group of data bits, in turn, is used to generate a corresponding check bit. In particular, a check bit is generated by performing an exclusive OR (XOR) operation on each of the data bits of the data word as specified by the particular row of the H-matrix corresponding to that particular check bit. For example, FIG. 4 depicts a portion of a circuit used to generate check bit 0 and in this regard indicates that an XOR operation is performed on data bits 10, 12, 14, 16, 18, 20, 22, 24, 36, 38, 40, 42, 44, 46, 48, 50, 62, 64, 66, 68, 70, 72, 74, 76, 88, 90, 92, 94, 96, 98, 100, 102, 114, 116, 118, 120, 122, 124, 126 and 128. The result of this XOR operation represents check bit 0. Consistent with FIG. 4, an examination of row 0 of the H-matrix of FIG. 10, which corresponds to check bit 0, reveals that a 1 resides in each of columns 10, 12, 14, 16, 18, 20, 22, 24, 36, 38, 40, 42, 44, 46, 48, 50, 62, 64, 66, 68, 70, 72, 74, 76, 88, 90, 92, 94, 96, 98, 100, 102, 114, 116, 118, 120, 122, 124, 126 and 128. This procedure is then repeated with respect to each row of the H-matrix to generate a total of 12 check bits associated with the data word.

Figure 3:
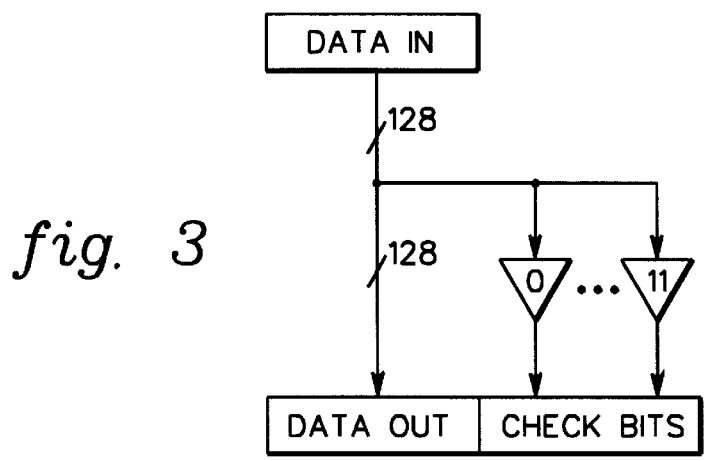
FIG. 3 depicts one example of a circuit used to generate a plurality of check bits associated with a data word in accordance with the present invention.

FIG. 3 depicts a partial circuit diagram of the check bit generation described above including the generation of each of check bits 0–11. In the embodiment depicted in FIG. 3, a 128 bit data word is written to memory together with 12 check bits generated in accordance with the principles of the present invention. As indicated above, each of the 12 check bits of FIG. 3 is generated by XORing a group of data bits selected according to the H-matrix. Subsequently, the 12 check bits, along with the 128 data bits are written to memory until a read operation is performed.

Figure 5:
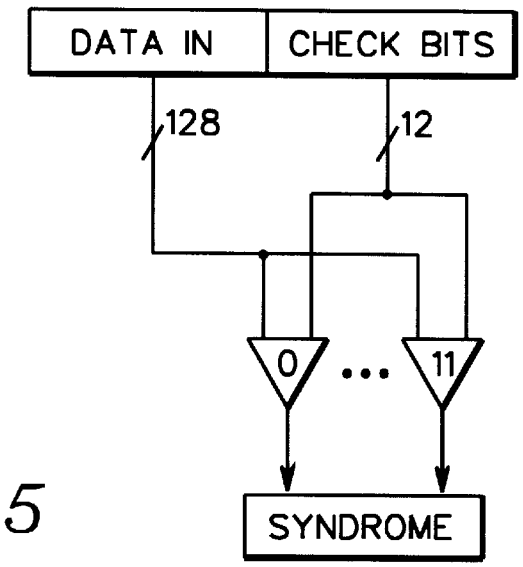
FIG. 5 depicts one example of a circuit used to generate a plurality of syndrome bits associated with the data word in accordance with the present invention.
Figure 6:
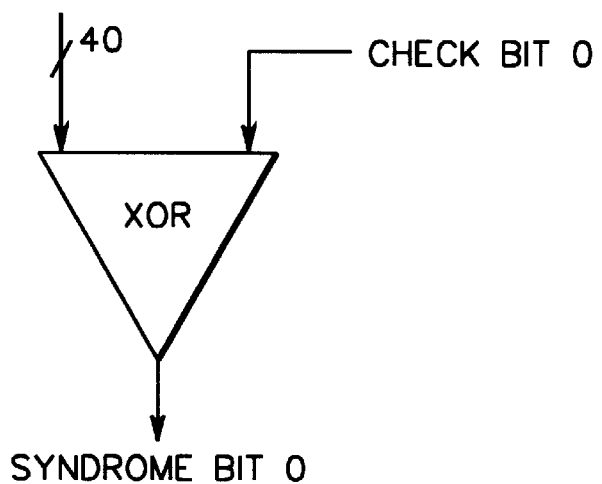
FIG. 6 depicts one example of a portion of the circuit of FIG. 5 used to generate a single syndrome bit.

Subsequent to the generation of the check bits and upon the occurrence of a read operation, a 12 bit syndrome is generated. As depicted in FIG. 5, when a read operation occurs, the 128 data bits together with the 12 associated check bits, previously written to memory as described above, are read from memory. After being read from memory, an XOR operation is again performed to generate the syndrome except that in this instance the XOR operation is performed on the group of data bits determined according to the H-matrix, as well as the corresponding check bit. Specifically, as shown in FIG. 6, an XOR operation is performed on data bits 10, 12, 14, 16, 18, 20, 22, 24, 36, 38, 40, 42, 44, 46, 48, 50, 62, 64, 66, 68, 70, 72, 74, 76, 88, 90, 92, 94, 96, 98, 100, 102, 114, 116, 118, 120, 122, 124, 126 and 128, as well as check bit 0. The result of this XOR operation represents syndrome bit 0. In addition, similar to the generation of the check bits, the data bits used in the XOR are determined according to the H-matrix. In other words, each of the data bits listed in FIG. 6 is shown as having a 1 in row 0 of the H-matrix of FIG. 10, and is also included in the group of data bits used to generate check bit 0 as described above. This procedure is then repeated with respect to each row of the H-matrix and with each corresponding check bit to generate a total of 12 syndrome bits associated with the data word.

Figure 7:
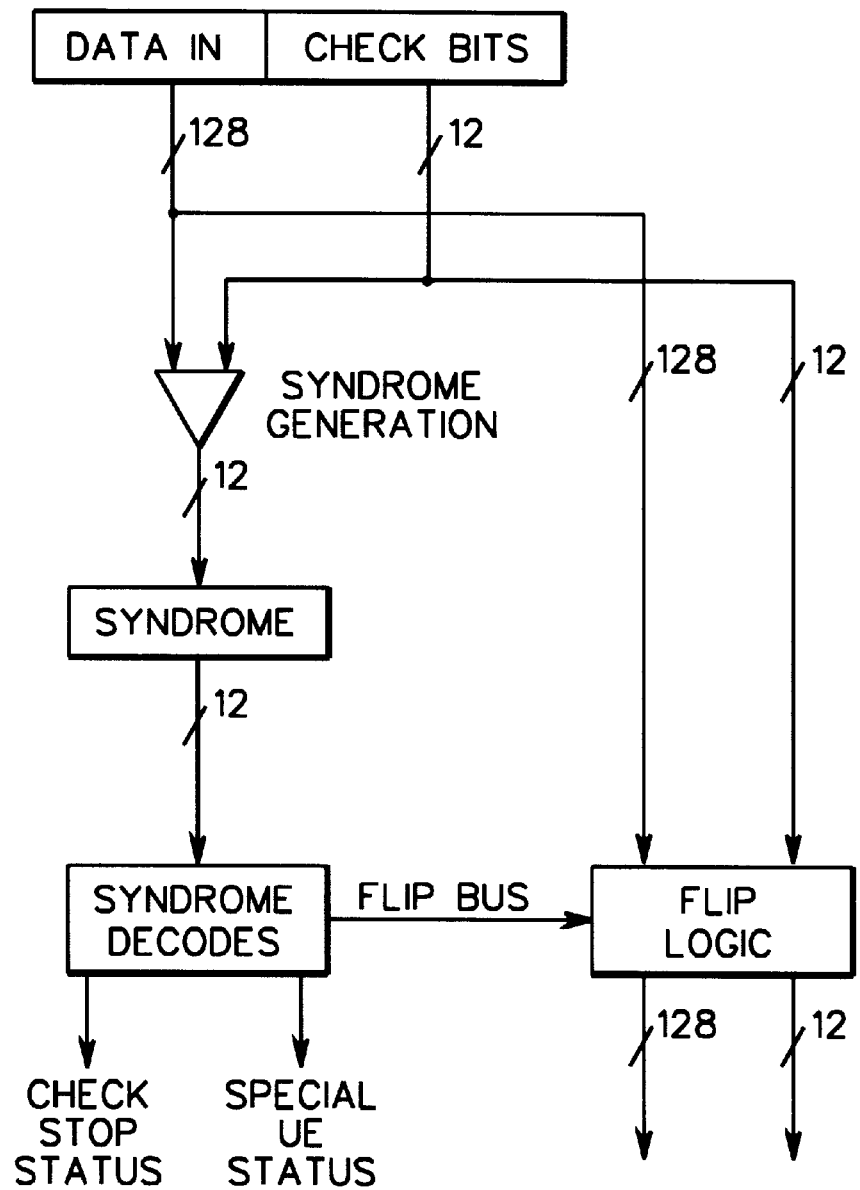
FIG. 7 depicts one example of a circuit used to decode the syndrome and correct any bits determined to be in error in accordance with the present invention.

After generation, as shown in FIG. 7, the syndrome is decoded to determine the presence of any erroneous data or check bits. In accordance with the principles of the invention, subsequent to syndrome decoding, any single error or double errors in a single symbol are corrected, as depicted in the FLIP LOGIC box of FIG. 7. Syndrome decoding is discussed below with reference to FIGS. 8 and 11, and error correction is discussed with reference to FIG. 9.

Figure 11A:
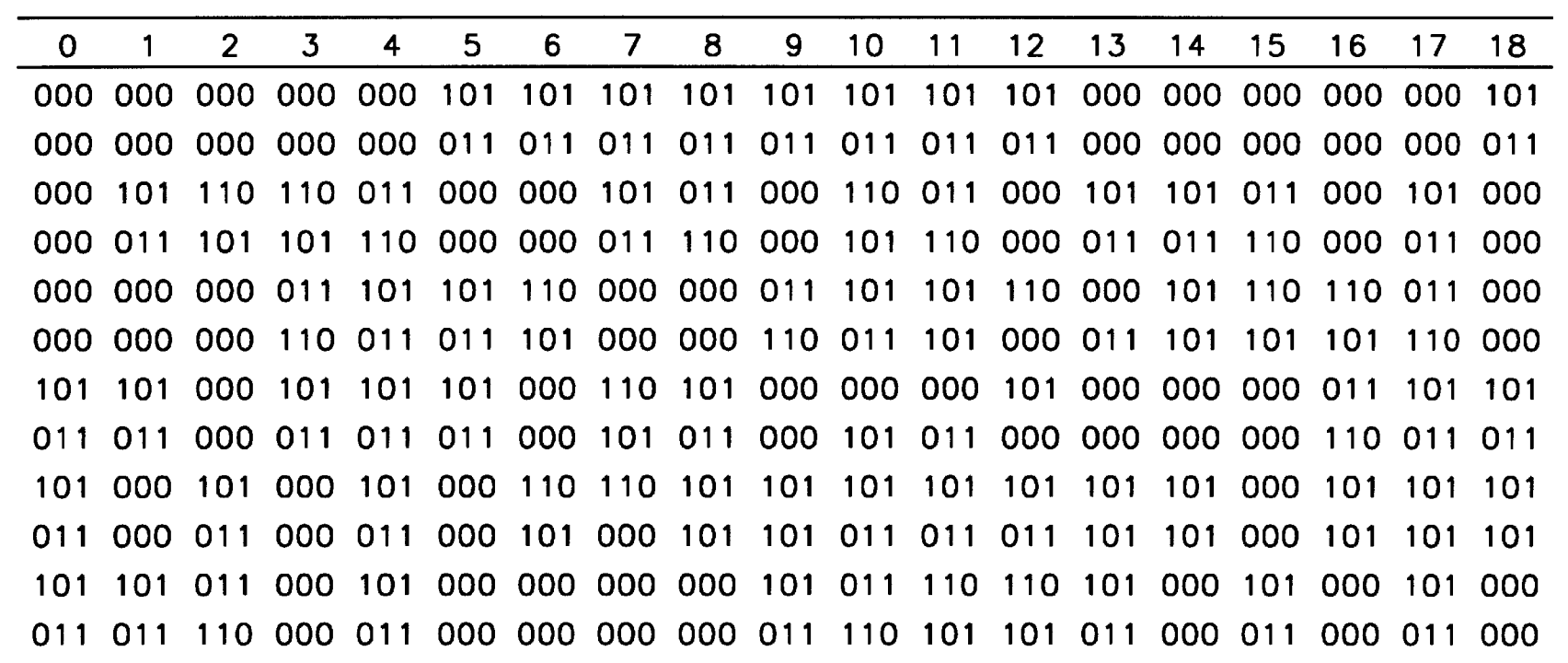

FIG. 11 depicts one embodiment of a syndrome decode table used to decode the syndrome generated above. Although alternate embodiments may exist, this particular decode table corresponds to the H-matrix of FIG. 9 and is comprised of a 12 row by 73 column table. Each of the 73 columns, in turn, corresponds to a particular symbol or chip of the data word. For instance, column 0 corresponds to symbol 0, and likewise, column 11 corresponds to symbol 11. Furthermore, each column is comprised of 3 sub-columns, with the first sub-column corresponding to the first bit of the symbol to which the column corresponds, the second sub-column corresponding to the second bit of the symbol to which the column corresponds, and the third sub-column corresponding to both the first and the second bits of the symbol to which the column corresponds. For instance, the first sub-column of column 1 corresponds to the first bit of symbol 1, the second sub-column of column 1 corresponds to the second bit of symbol 1, and the third sub-column of column 1 corresponds to both the first and the second bit of symbol 1.

The first two sub-columns of each column of the decode table are determined according to the H-matrix. Specifically, the first two sub-columns of each column are identical to their corresponding columns of the H-matrix. For example, the first sub-column of column 0 of the decode table is equal to column 0 of the H-matrix. Similarly, the second sub-column of column 2 of the decode table is equal to column 5 of the H-matrix. The third sub-columns of decode table columns, on the other hand, are determined by XORing the first and second sub-column of the respective column. Thus, XORing the first and second sub-columns of row 0, column 0 (i.e., 0 and 0) results in the 0 residing in the third sub-column of row 0, column 0, and likewise XORing the first and second sub-columns of row 2, column 1 (i.e., 1 and 0) results in the 1 residing in the third sub-column of row 2, column 1.

As noted above, the decode table of FIG. 10 comprises 12 rows. Each of these rows, in turn, corresponds to one bit of the 12 bit syndrome. Thus in this embodiment, the top row of the decode table corresponds to syndrome bit 0, and similarly, the bottom row of the decode table corresponds to syndrome bit 11.

After generating the syndrome bits, the syndrome is compared against the individual syndrome patterns in the syndrome decode table to determine whether a bit in error exists, and, if an error exists, to determine the location of any single symbol errors (i.e., either one error or two errors located on a single symbol), or the existence of any multiple symbol errors (i.e., errors existing on more than one symbol). First, if each and every bit of the syndrome is zero, no error exists and the data word requires no modification. If, however, each bit of the syndrome is not zero, the syndrome must be compared with the sub-columns of the columns of the decode table to determine the location of single symbol errors or in the alternative to detect the presence of multiple symbol errors.

Figure 8:
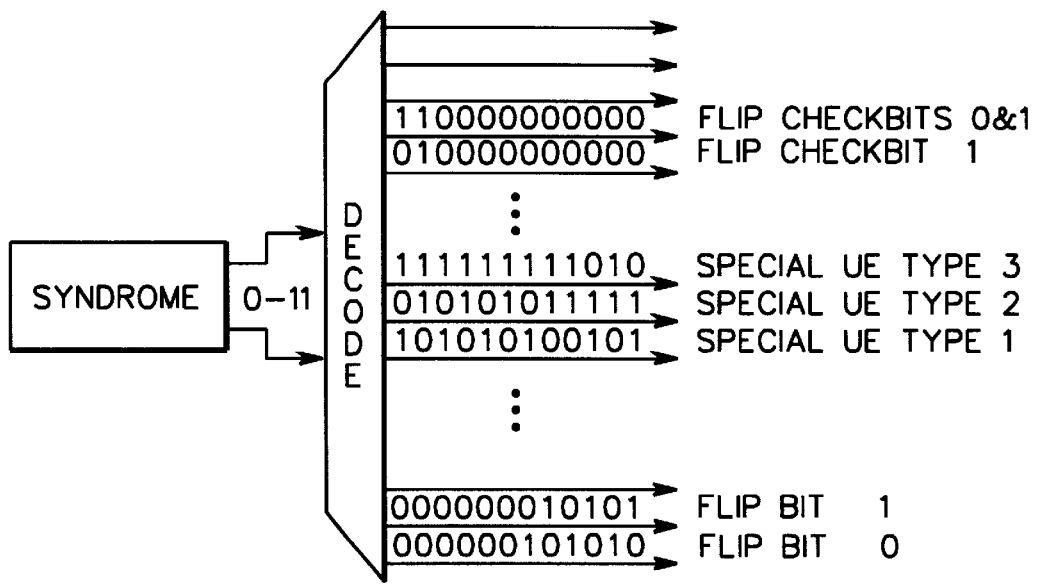
FIG. 8 depicts one example of a block diagram of the logic used to decode the syndrome of FIG. 5.

FIG. 8 depicts the logic used in determining the location of single symbol errors and the presence of multiple symbol errors. In this regard, each of the syndrome patterns shown in FIG. 8 corresponds to a sub-column of the decode table of FIG. 11, and as alluded to above, each sub-column indicates that either a single bit is in error, or that two bits in a single symbol are in error. To illustrate, sub-column 0 indicates that the first bit of symbol 0 is in error, sub-column 1 indicates that the second bit of symbol 0 is in error, and sub-column 3 indicates that both the first and the second bits of symbol 0 are in error. Accordingly, the generated syndrome may be compared against the syndrome patterns shown in FIG. 8 to determine the location of any single symbol errors. For instance, a generated syndrome of 000000101010 matches with the bottom syndrome pattern and indicates that the first bit of symbol 0, or in other words, bit 0 is in error. Similarly, a generated syndrome of 001100110011 matches with the sixth syndrome pattern from the bottom and indicates that both the first and the second bit of symbol 1, or in other words, bits 2 and 3 are in error. If, however, there are no matches between the generated syndrome and the sub-columns of the decode table and if all of the syndrome bits are not 0, then a multiple symbol error is determined to exist and an appropriate error message must be generated, as discussed in greater detail below.

Figure 9:
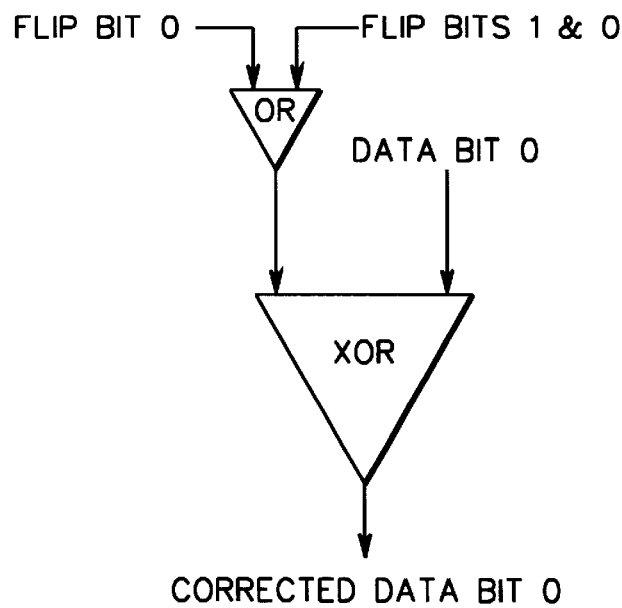
FIG. 9 depicts one example of a circuit used to correct a bit determined to be in error.

Subsequent to decoding the syndrome, uncorrectable error messages are generated in response to the detection of a multiple symbol error. Additionally, any single symbol errors are also corrected at this time. FIG. 9 depicts one embodiment of a circuit used to correct bits determined to be in error. More specifically, the inputs to the OR operation correspond to scenarios that affect the bit at issue. In this case, the bit at issue is bit 0 and the scenarios that affect bit 0 are if bit 0 is in error or if bits 0 and 1 are in error. Each of these inputs is set to 1 if the respective scenario is determined to exist by syndrome decoding as discussed above, otherwise the input is set to 0. Thus, in this example if bit 0 is determined to be in error, that particular input is set to 1. Subsequently, the OR of the two inputs is XORed with the data bit at issue to either correct an erroneous data bit, or leave unmodified a data bit determined to be correct. Hence, in this instance, the OR of the two inputs, or 1, is XORed with data bit 0 to complement data bit 0, thereby producing a corrected data bit 0.

In accordance with another aspect of the present invention, upon the detection of an uncorrectable error, as described above, a check bit pattern indicating the occurrence and location of the uncorrectable error is generated and incorporated into the corrupted data word. The importance of such a capability is illustrated with reference to FIG. 1. As discussed above, computer system 100 is typically comprised of a number of components, for example, memory 110, MSC 120, cache 130, MSC/cache interface 116, and a number of CPUs 140. In such a system, one of a number of components or locations and operations are susceptible to data corruption. If the corrupted data turns out to be correctable, the system will simply correct the corrupted bits and continue with processing. If, however, the error turns out to be uncorrectable (e.g., a multiple symbol error), an indication is made indicating the existence of an uncorrectable error so that the data is not mistakenly believed to be error-free after being transmitted to a subsequent component. In addition, an indication is also made isolating the location of the error so that only that component need be repaired or replaced. In the absence of the latter feature, the corrupted data, although flagged as being erroneous, would be continually stored and retrieved to various locations without providing any indication as to where the error actually occurred. Thus, a user or system administrator would be left to identify the flawed component through other means.

As briefly mentioned above, data corruption can occur at any of a number of components in computer system 100. For example, a flawed cache 130 could produce errors or corrupt data stored to or retrieved from cache 130 from CPUs 140 or from MSC 120 (i.e., a Type 1 error). Similarly, a flawed memory 110 could, in the same manner, produce its own errors (i.e., a Type 3 error). In addition, it is also possible that data could be corrupted during its transmission between cache 130 and MSC 120 in MSC/cache interface 116 (i.e., a Type 2 error).

Figure 14:
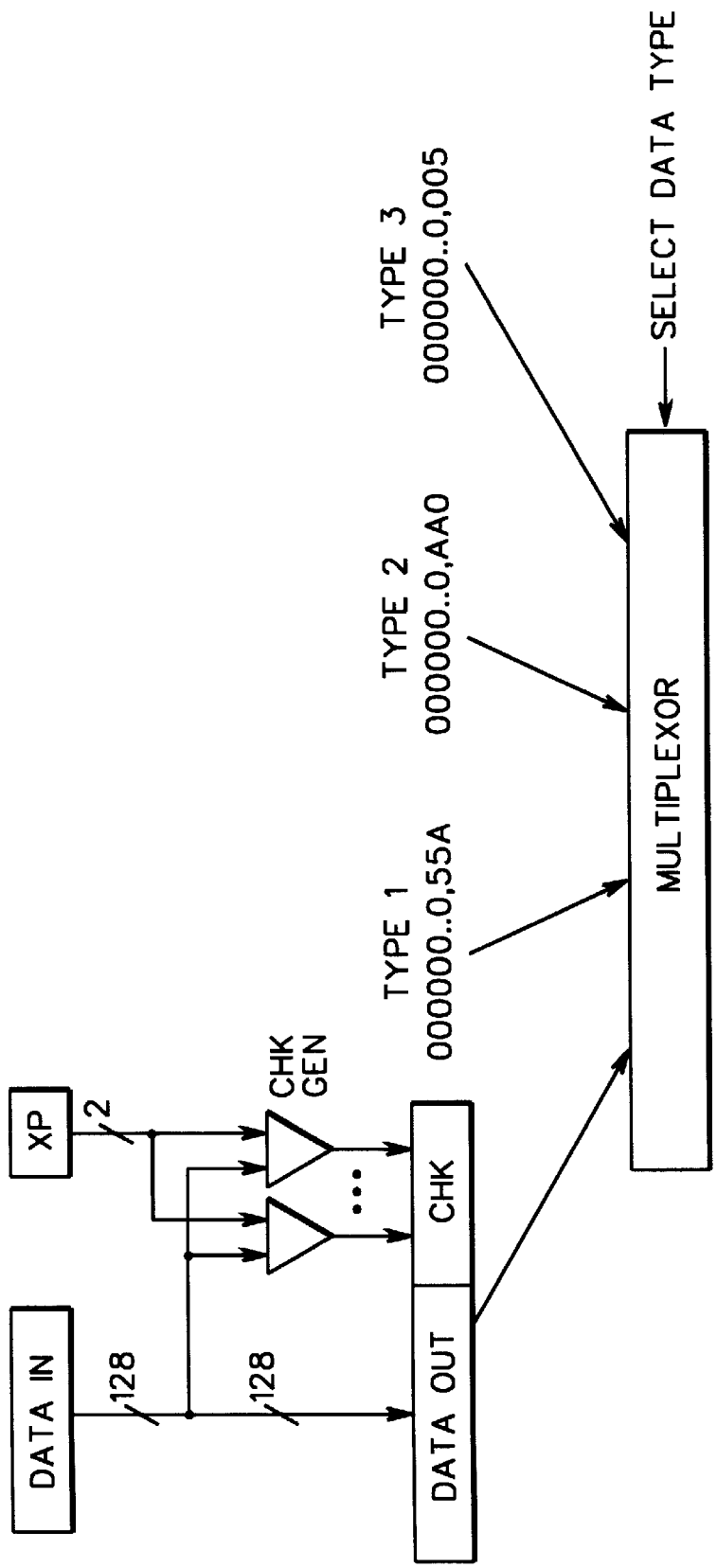
FIG. 14 depicts one example of a portion of a circuit used to generate special uncorrectable error codes in accordance with the present invention.

In accordance with the principles of the present invention, upon the occurrence of an uncorrectable error (e.g., Type 1, 2 or 3), a special check bit pattern is generated to indicate that an uncorrectable error has occurred and also to identify the exact location of data corruption. In one example, referring to FIG. 14, check bit patterns of 55A (hex), AA0 (hex), and 005 (hex) are generated to indicate the occurrence of Type 1, Type 2, and Type 3 errors, respectively. Thus, the occurrence of an uncorrectable error detected after fetching data from cache 130 (i.e., Type 1) would result in the generation of a check bit pattern of 55A. Likewise, the detection of uncorrectable errors in the MSC/cache interface and at memory 110 would result in the generation of check bit patterns of AA0 and 005, respectively. This check bit pattern then may be used to isolate the uncorrectable error to a particular component, as discussed below.

Subsequent to the generation of the appropriate check bit pattern, instead of incorporating check bits generated during error free transmissions (i.e., transmissions free from uncorrectable errors) into the data word, as discussed previously with embodiments lacking the uncorrectable error isolation aspect of the invention, the data bits of the data word are forced to zero and the appropriate check bit pattern resulting from the occurrence of an uncorrectable error (e.g., 55A, AA0, or 005) is incorporated into the data word. In this manner, indication of the occurrence of an uncorrectable error at a particular component is encoded into the data word and, as a result, may be used to identify such flawed component during subsequent transmissions of the data word, as discussed below.

After incorporating the special check bit pattern into the data word, the data word and the check bit pattern are transmitted to and received by another component of the computer system. This receiving component, and other subsequent receiving components, become aware of the uncorrectable error, as well as the location or component in which the uncorrectable error occurred by generating and then decoding a syndrome from the data word and special check bit pattern incorporated therein. More specifically, the receiving component first generates the syndrome in a manner similar to embodiments lacking the uncorrectable error isolation aspect of the invention, as previously described. In this regard, the data bits dictated by the H-matrix (see e.g., FIG. 10) are XORed along with their corresponding check bit (see, FIGS. 5–6). However, since all of these data bits have previously been forced to zero, the only non-zero bits are those of the special check bit patterns. Consequently, in embodiments incorporating the uncorrectable error isolation feature of the present invention, decoding these data words produces one of three special uncorrectable error syndromes, as depicted in FIG. 9, namely 101010100101, 010101011111, or 111111111010. These three syndromes, in turn, correspond to Type 1, Type 2, and Type 3 errors, respectively. Hence, after the syndrome decode process, a syndrome of 101010100101 indicates that an uncorrectable error has occurred in cache 130. Similarly, a syndrome of 010101011111 indicates that an uncorrectable error has occurred in memory 110. Thus, in this manner, the exact location of occurrence of an uncorrectable error may be isolated.

After detecting an uncorrectable error, any one of a number of recovery procedures may take place. For example, the component that detected the uncorrectable error may add the occurrence and location of the error to a record (e.g., a log or file) for later use, and/or disable or restart that particular component. Similarly, once a component has been determined to be flawed, the computing system may simply avoid utilizing such component. Furthermore, the system may also transmit a message indicating the occurrence of an uncorrectable error to a remote destination external to the system to, for instance, request technical support.

Thus, described in detail above are a computer system and logic used in an embodiment of the present invention for isolating uncorrectable errors occurring in a component of a computing system. As discussed above, in accordance with one aspect of the invention, a special check bit pattern is generated upon the detection of an uncorrectable error. This check bit pattern corresponds to the component responsible for generating the uncorrectable error and is used to indicate the particular component responsible for causing the uncorrectable error. Then, the check bit pattern is incorporated into the data word so that the error may later be isolated to a particular component.

Furthermore, it should be noted that the specific OR or XOR operations described in the embodiments above are utilized for exemplary reasons only, and that the present invention is not to be construed as being limited to only those specific operations. To the contrary, other operations, for example the complements of the OR and XOR operations, may just as easily be implemented without departing from the principles of the instant invention.

It should also be noted that although the subsets of the above embodiments are depicted as comprising two rows, the present invention is not to be construed as being limited to subsets comprising two rows. To the contrary, a subset having, for example, a single row may just as easily be implemented without departing from the principles of the instant invention.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are merely exemplary. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of isolating an uncorrectable error to one component of a plurality of components of a computing system, said method comprising:

generating, upon detection of an uncorrectable error in a data word at said one component of said computing system, a check bit pattern to indicate occurrence of said uncorrectable error at said one component; and incorporating said check bit pattern into said data word.

2. The method of claim 1, wherein said data word comprises a plurality of data bits and said check bit pattern incorporated therein, and said incorporating comprises forcing said data bits, but not said check bit pattern, to zero.

3. The method of claim 1, wherein said generating occurs in said one component and said method further comprises transmitting said data word and said check bit pattern incorporated therein to another component of said computing system thereby indicating occurrence of said uncorrectable error at said one component.

4. The method of claim 1, further comprising fetching, by another component of said computing system, said data word and said check bit pattern incorporated therein thereby indicating occurrence of said uncorrectable error at said one component.

5. The method of claim 1, further comprising generating a syndrome according to a group of bits of said data word and of said check bit pattern, wherein said group of bits are selected according to a H-matrix and wherein said syndrome, due to said check bit pattern, indicates the existence of an uncorrectable error at said one component.

6. The method of claim 5, further comprising decoding said syndrome, wherein said decoding indicates the occurrence and location in said computing system of said uncorrectable error.

7. The method of claim 1, wherein said uncorrectable error occurs at one or more locations in said computing system.

8. The method of claim 1, wherein said plurality of components of said computing system comprises at least one of a cache, a main storage controller, a main memory, and an interface between said cache and said main storage controller, and wherein said one component comprises at least one of said cache, said main memory, and said interface.

9. The method of claim 1, further comprising performing a recovery action, wherein said recovery action comprises one of adding said occurrence of said uncorrectable error to a record, disabling said one component, restarting said one component, transmitting a message indicating said occurrence to a destination external of said computing system, and no longer utilizing said one component by said computing system.

10. A system for isolating an uncorrectable error to one component of a plurality of components of a computing system, said system comprising:

means for generating, upon detection of an uncorrectable error in a data word at said one component of said computing system, a check bit pattern to indicate occurrence of said uncorrectable error at said one component; and means for incorporating said check bit pattern into said data word.

11. The system of claim 10, wherein said data word comprises a plurality of data bits and said check bit pattern incorporated therein, and said means for incorporating comprises means for forcing said data bits, but not said check bit pattern, to zero.

12. The system of claim 10, wherein said means for generating is located in said one component and said system further comprises means for transmitting said data word and said check bit pattern incorporated therein to another component of said computing system thereby indicating occurrence of said uncorrectable error at said one component.

13. The system of claim 10, further comprising means for fetching, by another component of said computing system, said data word and said check bit pattern incorporated therein thereby indicating occurrence of said uncorrectable error at said one component.

14. The system of claim 10, further comprising means for generating a syndrome according to a group of bits of said data word and of said check bit pattern, wherein said group of bits are selected according to a H-matrix and wherein said syndrome, due to said check bit pattern, indicates the existence of an uncorrectable error at said one component.

15. The system of claim 14, further comprising means for decoding said syndrome, wherein said means for decoding indicates the occurrence and location in said computing system of said uncorrectable error.

16. The system of claim 10, wherein said uncorrectable error occurs at one or more locations in said computing system.

17. The system of claim 10, wherein said plurality of components of said computing system comprises at least one of a cache, a main storage controller, a main memory, and an interface between said cache and said main storage controller, and wherein said one component comprises at least one of said cache, said main memory, and said interface.

18. The system of claim 10, further comprising means for performing a recovery action, wherein said means for performing a recovery action comprises one of means for adding said occurrence of said uncorrectable error to a record, means for disabling said one component, means for restarting said one component, means for transmitting a message indicating said occurrence to a destination external of said computing system, and means for no longer utilizing said one component by said computing system.

19. A system for isolating an uncorrectable error to one component of a plurality of components of a computing system, said system comprising:

a computing node capable of generating, upon detection of an uncorrectable error in a data word at said one component of said computing system, a check bit pattern to indicate occurrence of said uncorrectable error at said one component; and said computing node further being capable of incorporating said check bit pattern into said data word.

20. An article of manufacture comprising:

a computer useable medium having computer readable programs code means embodied therein for isolating an uncorrectable error to one component of a plurality of components of a computing system, said computer readable program code means in said article of manufacture comprising:

computer readable program code means for generating, upon detection of an uncorrectable error in a data word at said one component of said computing system, a check bit pattern to indicate occurrence of said uncorrectable error at said one component; and computer readable program code means for incorporating said check bit pattern into said data word.

21. The article of manufacture of claim 20, wherein said data word comprises a plurality of data bits and said check bit pattern incorporated therein, and said computer readable program code means for incorporating comprises computer readable program code means for forcing said data bits, but not said check bit pattern, to zero.

22. The article of manufacture of claim 20, wherein said computer readable program code means for generating is located in said one component and said article of manufacture further comprises computer readable program code means for transmitting said data word and said check bit pattern incorporated therein to another component of said computing system thereby indicating occurrence of said uncorrectable error at said one component.

23. The article of manufacture of claim 20, further comprising computer readable program code means for fetching, by another component of said computing system, said data word and said check bit pattern incorporated therein thereby indicating occurrence of said uncorrectable error at said one component.

24. The article of manufacture of claim 20, further comprising computer readable program code means for generating a syndrome according to a group of bits of said data word and of said check bit pattern, wherein said group of bits are selected according to a H-matrix and wherein said syndrome, due to said check bit pattern, indicates the existence of an uncorrectable error at said one component.

25. The article of manufacture of claim 24, further comprising computer readable program code means for decoding said syndrome, wherein said computer readable program code means for decoding indicates the occurrence and location in said computing system of said uncorrectable error.

26. The article of manufacture of claim 20, wherein said uncorrectable error occurs at one or more locations in said computing system.

27. The article of manufacture of claim 20, wherein said plurality of components of said computing system comprises at least one of a cache, a main storage controller, a main memory, and an interface between said cache and said main storage controller, and wherein said one component comprises at least one of said cache, said main memory, and said interface.

28. The article of manufacture of claim 20, further comprising computer readable program code means for performing a recovery action, wherein said computer readable program code means for performing a recovery action comprises one of computer readable program code means for adding said occurrence of said uncorrectable error to a record, computer readable program code means for disabling said one component, computer readable program code means for restarting said one component, computer readable program code means for transmitting a message indicating said occurrence to a destination external of said computing system, and computer readable program code means for no longer utilizing said one component by said computing system.

* * * * *